United States Patent [19]

Sullivan et al.

[11] Patent Number: 4,745,297

[45] Date of Patent: May 17, 1988

[54] SPECIMEN HOLDER FOR HOLDING SPECIMEN STUBS TO BE COATED IN AN ION-BEAM SPUTTER COATING UNIT

[75] Inventors: William H. Sullivan, Gillette; Marjorie Jamieson, Berkeley Heights, both of N.J.

[73] Assignee: Hoechst Celanese Corporation, Somerville, N.J.

[21] Appl. No.: 15,463

[22] Filed: Feb. 17, 1987

[51] Int. Cl.$^4$ .............................................. G01F 21/00
[52] U.S. Cl. ................................... 250/440.1; 118/500
[58] Field of Search ................. 250/440.1; 118/500; 211/128, 129

[56] References Cited

U.S. PATENT DOCUMENTS

| | | | |
|---|---|---|---|
| 3,195,502 | 7/1965 | Levy | 118/500 |
| 3,245,545 | 4/1966 | Lortie | 211/129 |
| 3,452,880 | 7/1969 | Kovacik et al. | 211/129 |
| 3,461,842 | 8/1969 | Conrad et al. | 118/500 |
| 4,485,759 | 12/1984 | Brandolf | 118/500 |

OTHER PUBLICATIONS

"A Container for Handling Small Specimens During Preparation and Examination in the Scanning Electron Microscope (SEM)", Taylor, *Journal of Microscopy*, vol. 105, Dec. 1975, pp. 335–338.

*Primary Examiner*—Bruce C. Anderson
*Attorney, Agent, or Firm*—Lynch, Cox, Gilman & Mahan

[57] ABSTRACT

A specimen holder for use in an ion beam sputter coating machine to prepare a specimen placed on a specimen stub for analysis by a scanning electron microscope. The specimen holder is comprised of two planar members, each containing a plurality of openings sufficient in size to hold a specimen stub, with screws projecting through the lip of the upper planar member to allow the specimen holder to securely hold the specimen stubs within the openings in the planar member. The lower planar member has a limited rotation, in relation to the upper planar member, to prevent the specimen stubs from falling through the openings in the specimen holder.

14 Claims, 1 Drawing Sheet

SPECIMEN HOLDER FOR HOLDING SPECIMEN STUBS TO BE COATED IN AN ION-BEAM SPUTTER COATING UNIT

BACKGROUND OF INVENTION

1. Field of Invention

This invention relates to a specimen holding device. In particular, this invention relates to a device for holding specimen stubs for coating in an ion beam sputter coating machine to be used in a scanning electron microscope.

2. Prior Art

Specimen samples to be analyzed by a scanning electron microscope are first deposited on flat metal disks, called "specimen stubs." After the sample is deposited on the stub, the stub is coated in an ion beam sputter coating machine with a thin film of an ionized metal, such as gold or palladium, and then placed in the scanning electron microscope for analysis. Once the stub has been coated with the sample, it is crucial that it not come in contact with any foreign material, as could be present on a technician's fingers or gloves. Fingerprints or other contact by technicians may result in the sample not being accurately viewed by the scanning electron microscope.

In older model scanning electron microscopes, the flat metal specimen stubs had an attached stem, which could be touched by the technician without harm to the sample. However, in modern scanning electron microscopes, such as a model JEOL JXA-840 scanning micro analyzer manufactured by JEOL LTD. of Tokyo, Japan, the stubs used for holding the sample are in the form of a disk that does not have a stem.

Before the stub can be coated in an ion beam sputter coating machine, it is secured in a sample holder. The holder prevents any undesired movement of the stub in the coating machine and secures it in a correct position for coating by the gaseous metal cloud generated by the ion beam sputter coating machine.

An additional problem with prior art specimen holders is that they would only hold a limited number of samples, i.e., less than four at a time.

It is therefore an object of this invention to produce a specimen holding device to hold a specimen stub in an ion beam sputter coating machine prior to analysis under a scanning electron microscope.

It is a further object of this invention that the specimen holding device securely holds the specimen stubs during the coating process within the ion beam sputter coating machine.

It is another object of this invention that the specimen holder allows the specimen stubs to be removed from the specimen holder without being touched by a technician.

It is still a further object of this invention to produce a specimen holder which can hold more than three specimen stubs at the same time for coating with an ion beam sputter coating machine.

These and other objects, as well as the scope, nature, and utilization of this invention will be apparent to those skilled in the art from the following detailed description, drawings and appended claims.

SUMMARY OF INVENTION

The invention comprises a specimen holder for specimen stubs for use in a scanning electron microscope comprising:

(a) an upper planar member containing a plurality of openings, each opening larger in diameter than the diameter of the specimen stub;

(b) a lower planar member axially connected to the upper planar member containing a plurality of openings of equal number to those in the upper planar member, each opening larger in diameter than the diameter of the specimen stub;

(c) a means to limit the rotation of the lower planar member in relation to the upper planar member; and (d) a means to secure the specimen stubs within the openings of the upper planar member.

This specimen holder eliminates possible harmful physical contact by technicians touching specimen stubs. The specimen stub to be analyzed is held securely within the openings contained within the planar members of the specimen holder. The holder is then secured within the ion beam sputter coating machine for coating of the specimen stubs with a thin metallic film. After coating, the stubs can be removed from the specimen holder without the need for actual contact by the technician and can be placed within the scanning electron microscope for analysis. At least six specimen stubs may be held at one time in this specimen holding device.

BRIEF DESCRIPTION OF THE DRAWINGS

The invention will now be described with reference to the accompanying drawings in which.

DETAILED DESCRIPTION OF THE PREFERRED EMBODIMENT

Figure 1:
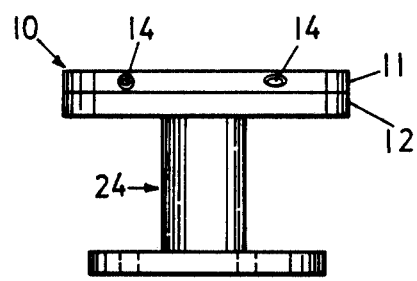
FIG. 1 is a side view of the specimen holding device.

Although the invention is applicable to a wide variety of applications, it is shown in the drawings for the purpose of illustration as embodied in an upper planar member, a lower planar member, a means for connecting the two together, a means to limit rotation of the lower planar member in relation to the upper planar member and a means to secure the specimen stubs within the upper planar member. Although these planar members may be of any convenient planar shape, in a preferred embodiment, the upper planar member and lower planar member are in the shape of circular disks.

Modern specimen stubs used in scanning electron microscopes are in the shape of a thickened circular disk approximately one-half to three-quarters of an inch in diameter and approximately one-half of an inch thick. To analyze a specimen sample, these specimen stubs are first coated with the sample, then placed within an ion beam sputter coating machine to coat the specimen stubs with a very thin coating, i.e. about 30 angstroms in thickness of a heavy metal such as gold or palladium, and finally placed in the scanning electron microscope for analysis. To coat these specimen stubs, they are first secured in a specimen holder and then seated within the ion beam sputter coating machine.

Figure 5:
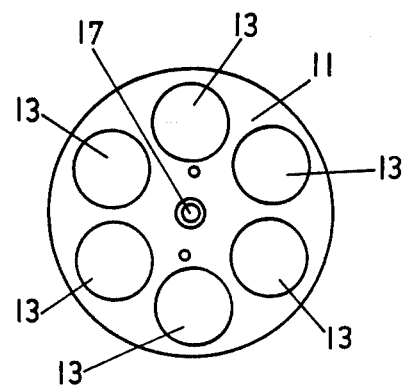
FIG. 5 is a top view of the upper disk-shaped planar member.

The specimen stubs are held within the specimen holder (10) of the instant invention by a two-disk-shaped planar member system, an upper disk (11) and a lower disk (12). The upper disk (11) is a circular flat disk containing a plurality of openings (13), with a minimum of six, each opening slightly larger in diameter than the diameter of the specimen stubs. In a preferred embodiment, each of these openings are located an equal distance from the axis of the upper disk (11). The diameter of the disk is not crucial and the larger the diameter, the greater the number of specimen stubs that can be held. (See FIG. 5.) The size is purely a function of the size of the opening in the ion-beam sputter coating machine to hold the specimen holder. In a preferred embodiment the disks are from 2 to 8 inches in diameter.

Figure 2:
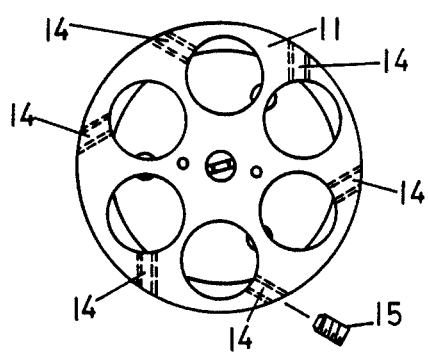
FIG. 2 is a top view of the specimen holding device with the disk-shaped planar members in the open position.

The upper disk also contains apertures (14) in the lip of the disk, equal in number to the number of openings in the upper disk. Each of these apertures (14), which run from the outside of the disk to the outside edge of each of the openings (13), are used to secure a specimen stub within the opening (13) by a securing means, such as a screw (15) inserted through the aperture. (See FIG. 2.)

Figure 7:
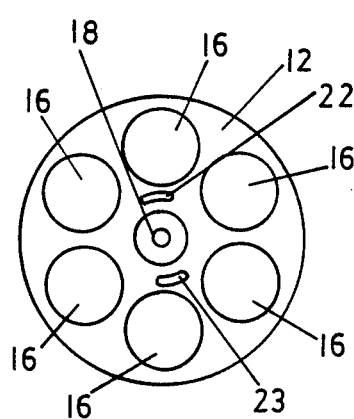
FIG. 7 is a top view of the lower disk-shaped planar member.

The lower disk (12) is approximately the same shape as the upper disk (11) with an equal number of openings (16) as those in the upper disk (11) but without apertures in the lip of the lower disk (12). (See FIG. 7.) The upper and lower disks may be made of any strong durable material, such as metal or heavy-duty plastic.

Figure 4:
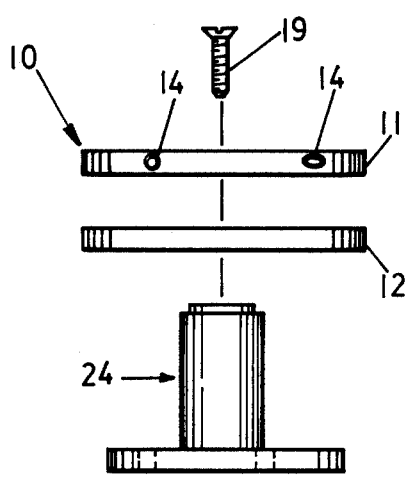
FIG. 4 is an exploded view of the specimen holding device.

The two disks are secured to each other through of the axis of each disk (17, upper disk axis; 18, lower disk axis) by any normal securing means such as a rivet, screw or other such securing means which will allow the disks to rotate axially in relation to each other. In a preferred embodiment, the axial rotation device is a bolt (19) running through each disk into a pedestal (24) for the specimen holder. (See FIG. 4.)

Figure 6:
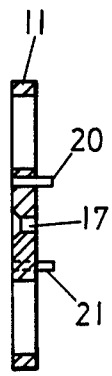
FIG. 6 is a side view of the upper disk-shaped planar member.
Figure 8:
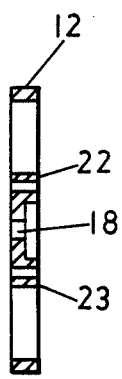
FIG. 8 is a side view of the lower disk-shaped planar member.

Attached to the upper disk is a means to limit the rotation of the lower disk about its axis in relation to the upper disk. In a preferred embodiment, attached to the lower surface of the upper disk (11) are at least two pins (20, 21) which project downwardly from the lower surface of the upper disk (see FIG. 6) into arc-shaped trenches (22, 23) contained in the lower disk (12). (See FIGS. 7 and 8.) The pins (20, 21) are located an equal distance from the axis of the upper disk (17) and 180 degrees apart. The pins move within the arc-shaped trenches (22, 23) in the lower disk (12). The length of these arc-shaped trenches (22, 23) must be sufficient to allow the lower disk (12) to rotate a sufficient number of degrees to prevent a specimen stub placed in the upper disk (11) from dropping out of the specimen holder (10). For example, if the upper and lower disks contain six openings, the arc-shaped trenches (22, 23) in the lower disk (12) will allow approximately a 30 degree rotation by the lower disk (12) in relation to the upper disk (11) from the position where the openings in each disk are in line. After rotation, the openings in the upper disk (13) are blocked by the space between the openings of the lower disk (16). (See FIGS. 2 and 3.) This prevents specimen stubs placed in the openings of the upper disk (13) from dropping out of the specimen holder (10).

The upper and lower disks are provided with a means to secure them to a pedestal (24) which is secured within the ion beam sputter coating machine. For example, an opening is provided in the axis of the upper and lower disk to allow a securing means to penetrate this opening into the pedestal (24). In a preferred embodiment the bolt (19) which passes through the axis of the disk to allow axial rotation is secured into the upper portion of the pedestal (24) (See FIG. 4). This pedestal and disk combination is then secured within the ion beam sputter coating machine for coating of the stubs.

Figure 3:
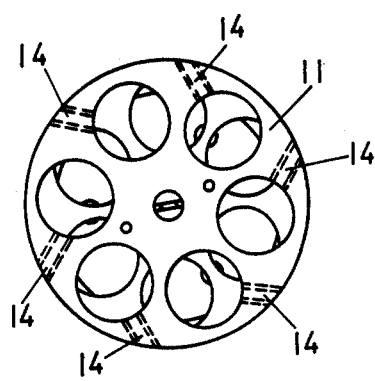
FIG. 3 is a top view of the specimen holding device with the lower disk-shaped planar member rotated to prevent the specimen stubs from being released from the specimen holder.

In operation, the lower disk (12) is rotated so that specimen stubs are prevented from falling out of the specimen holder when placed within the upper disk (11) (See FIG. 3). The specimen stubs to be coated are placed within the specimen holder (10). A screw (15) running through an aperture in the lip of the upper disk is tightened to securely hold each stub within the upper disk (11). The upper disk and lower disk are then secured to the pedestal by a bolt (19) running through the axis of the upper disk (17) and the axis of the lower disk (18). After the stubs are loaded and secured, the specimen holder and pedestal are secured within the ion beam sputter coating machine. The specimen stubs are then coated by a thin coating of a heavy metal, such as gold or palladium, and removed from the ion beam sputter coating machine. The lower disk (12) is then rotated to line up the openings of the upper disk (13) and the openings of the lower disk (16) (See FIG. 2). The specimen stubs still do not fall from the specimen holder, because of the screws (such as 15) projecting through the apertures in the lip of the upper disk (11), which hold the stubs securely in place. As the technician wishes to use the particular specimen stubs, that technician unscrews the screw (15) holding each stub and allows it to fall from the specimen holder (10). The specimen stub is then placed within the scanning electron microscope by tweezers or other such holding device and analyzed by the electron microscope.

I claim:

1. A specimen holder for holding specimen stubs for use in a scanning electron microscope comprising:
    (a) an upper planar member containing a plurality of openings, each opening larger in diameter than the diameter of the specimen stub;
    (b) a lower planar member axially connected to the upper planar member containing a plurality of openings of equal number to those in the upper planar member, each said opening larger in diameter than the diameter of the specimen stub;
    (c) a means to limit the axial rotation of the lower planar member in relation to the upper planar member; and
    (d) a means to secure the specimen stubs within the openings of the upper planar member.

2. The specimen holder of claim 1 wherein the upper planar member and lower planar member contain at least six openings.

3. The specimen holder of claim 1 wherein the means for limiting the axial rotation of the lower planar member in relation to the upper planar member comprises:
    (a) at least two pins projecting downward from the upper planar member, an equal distance from the axis of the upper planar member and opposite each other; and (b) arc-shaped trenches within the lower planar member to receive the pins.

4. The specimen holder of claim 1 wherein the means to secure the specimen stubs within the openings of the upper planar member comprises a screw projecting through the lip of the upper planar member into one of the openings contained in the upper planar member.

5. The specimen holder of claim 1 wherein the openings of the upper planar member can be lined up with the openings of the lower planar member.

6. The specimen holder of claim 1 wherein the upper planar member is rotated in relation to the lower planar member to allow the specimen stubs to fall out of the specimen holder.

7. The specimen holder of claim 3 wherein the pins and the arc-shaped trenches allow the lower planar member to rotate from about 0 degrees to about 60 degrees around its axis in relation to the axis of the upper planar member.

8. The specimen holder of claim 1 wherein upper and lower planar members is secured to a pedestal for placement within an ion beam sputter coating machine.

9. The specimen holder of claim 1 wherein the planar members are constructed of metal.

10. A specimen holder for holding specimen stubs for use in a scanning electron microscope comprising:

(a) an upper planar member containing at least six openings, each opening larger in diameter than a specimen stub;

(b) a lower planar member axially connected to the upper planar member containing at least six openings each larger in diameter than the specimen stub;

(c) at least one pair of pins projecting downward from the upper planar member into arc-shaped trenches in the lower planar member to limit rotation of the upper planar member in relation to the lower planar member; and (d) securing means projecting through a lip of the upper planar member to secure the stubs within the upper planar members.

11. The specimen holder of claim 1 wherein the securing means is a screw projecting through the lip of the upper planar member into one of the openings of the upper planar member.

12. The specimen holder of claim 10 wherein the securing means is a screw projecting through the lip of the upper planar member into one of the openings of the upper planar member.

13. The specimen holder of claim 1 wherein the upper planar member and the lower planar member are in the shape of a circular disk.

14. The specimen holder of claim 10 wherein the upper planar member and the lower planar member are in the shape of a circular disk.

* * * * *